(12) United States Patent
Lee et al.

(10) Patent No.: US 8,497,053 B2
(45) Date of Patent: Jul. 30, 2013

(54) PIGMENT DISPERSION COMPOSITION, RESIST COMPOSITION FOR COLOR FILTER INCLUDING THE SAME, AND COLOR FILTER USING THE SAME

(75) Inventors: Chang-Min Lee, Goyang (KR); Kil-Sung Lee, Gwacheon (KR); Jae-Hyun Kim, Seongnam (KR); Eui-June Jeong, Seoul (KR)

(73) Assignee: Cheil Industries Inc., Gumi-si (KR)

( * ) Notice: Subject to any disclaimer, the term of this patent is extended or adjusted under 35 U.S.C. 154(b) by 541 days.

(21) Appl. No.: 12/721,606

(22) Filed: Mar. 11, 2010

(65) Prior Publication Data

US 2010/0167188 A1    Jul. 1, 2010

Related U.S. Application Data

(63) Continuation-in-part of application No. PCT/KR2007/ 007033, filed on Dec. 31, 2007.

(30) Foreign Application Priority Data

Sep. 11, 2007    (KR) ........................ 10-2007-0092122

(51) Int. Cl.
*G03F 7/00* (2006.01)
*G03F 7/004* (2006.01)
*G03F 7/033* (2006.01)

(52) U.S. Cl.
USPC ........ 430/7; 430/270.1; 430/270.15; 430/905

(58) Field of Classification Search
None
See application file for complete search history.

(56) References Cited

U.S. PATENT DOCUMENTS

| 6,783,813 | B2 | 8/2004 | You et al. |
| 7,347,894 | B2 | 3/2008 | Yanagimoto et al. |
| 7,781,129 | B2 | 8/2010 | Tatsuzawa et al. |
| 2002/0187412 | A1 | 12/2002 | You et al. |
| 2006/0098316 | A1 | 5/2006 | Tatsuzawa et al. |
| 2007/0065736 | A1 | 3/2007 | Yamagata et al. |

FOREIGN PATENT DOCUMENTS

| JP | 2005-283950 | | 10/2005 |
| JP | 2006-047686 | | 2/2006 |
| JP | 2006-215452 | | 8/2006 |
| JP | 2007-023168 | A | 2/2007 |
| KR | 10-2005-0025658 | A | 3/2005 |
| KR | 10-2006-0110221 | A | 10/2006 |
| WO | 2009/035189 | A1 | 3/2009 |

OTHER PUBLICATIONS

Disperbyk 2000 final(2012).*
Translation JP 2005-283950(Oct. 2005).*
International Search Report and Written Opinion in counterpart International Application No. PCT/KR2007/007033, dated Jun. 3, 2008.

* cited by examiner

*Primary Examiner* — Amanda C. Walke
(74) *Attorney, Agent, or Firm* — Summa, Additon & Ashe, P.A.

(57) ABSTRACT

The present invention relates to a pigment dispersion composition that is capable of decreasing pattern residues and improving resolution, a resist composition for a color filter including the same, and a color filter fabricated using the same. More particularly, the pigment dispersion composition includes a pigment, a binder resin, a solvent, and a first dispersing agent and a second dispersing agent each represented by a predetermined chemical formula.

10 Claims, 5 Drawing Sheets

PIGMENT DISPERSION COMPOSITION, RESIST COMPOSITION FOR COLOR FILTER INCLUDING THE SAME, AND COLOR FILTER USING THE SAME

CROSS-REFERENCE TO RELATED APPLICATIONS

This application is a continuation-in-part of International Application No. PCT/KR2007/007033, filed Dec. 31, 2007, pending, which designates the U.S., published as WO 2009/035189, and is incorporated herein by reference in its entirety, and claims priority therefrom under 35 USC Section 120. This application also claims priority under 35 USC Section 119 from Korean Patent Application No. 10-2007-0092122, filed Sep. 11, 2007, in the Korean Intellectual Property Office, which is also incorporated herein by reference in its entirety.

FIELD OF THE INVENTION

The present invention relates to a pigment dispersion composition for a color filter, a resist composition for a color filter including the same, and a color filter fabricated using the same. More particularly, the present invention relates to a pigment dispersion composition capable of decreasing pattern residues and improving resolution, a resist composition for a color filter including the same, and a color filter fabricated using the same.

BACKGROUND OF THE INVENTION

An image sensor is a part for photographing images in a portable phone camera or a DSC (digital still camera). It can be classified as a charge-coupled device (CCD) image sensor or a complementary metal oxide semiconductor (CMOS) image sensor, depending upon method used to make the same and its application.

A color photographing part for a charge-coupled device (CCD) image sensor or a complementary metal oxide semiconductor (CMOS) image sensor includes color filters each having additive mixing primary color filter segments of red, green, and blue, and the colors are separated.

A recent color filter embodied in the color photographing part has a pattern size of 2 μm or less, which is in a range of 1/100th to 1/200th that of the conventional color filter pattern for the LCD. Accordingly, increased resolution and decreased pattern residues are important factors to consider when determining the performance of a device.

It is believed that the kind and composition ratio of a photoinitiator, a monomer, and a binder and the pigment dispersion solution determine whether the resolution is increased and the pattern residues are decreased. Furthermore, in order to provide a fine pattern, the pigment dispersion solution should be prepared to have a small particle diameter and a composition that does not leave pattern residues when developing an image. In order to decrease the dispersing particle diameter of the pigment dispersion solution, the pigment should have a small primary particle diameter, and the kind and amount of a dispersing agent should be considered.

Recently-developed pigments for electronic materials have a primary particle diameter of around 50 nm to reduce the size of the particles after dispersion. In the case of a dispersing agent, it is possible to maintain dispersion by introducing a functional group that is capable of adhering to the surface of a pigment to provide a steric hindrance effect between the pigment particles and to leave a certain gap between them.

The dispersing agent may include resins that are capable of providing enough steric hindrance, for example polyesters, acrylic resins, modified urethane resins, polyesters, and the like.

It is possible to provide a fine dispersion by using a dispersing agent that is capable of adhering to the pigment having a small particle diameter and providing the steric hindrance between particles so that the pigment is sufficiently dispersed. If the pigment dispersion solution further includes a dispersing agent that is capable of decreasing pattern residues when developing images, the resist composition for a color filter including the pigment dispersion solution may achieve a fine pattern.

SUMMARY OF THE INVENTION

An exemplary embodiment of the present invention provides a pigment dispersion composition, a resist composition for a color filter including the same, and a color filter made using the same.

Another embodiment of the present invention provides a pigment dispersion composition in which the pigment can be well dispersed and developed in order to decrease pattern residues and improve resolution upon forming a pattern.

Yet another embodiment of the present invention provides a resist composition for a color filter including the pigment dispersion composition.

A further embodiment of the present invention provides a color filter fabricated using the composition for the color filter.

The embodiments of the present invention are not limited to the above technical purposes, and a person of ordinary skill in the art can understand other technical purposes.

According to one embodiment of the present invention, provided is a pigment dispersion composition including a pigment, a binder resin, a solvent, and a dispersing agent. The dispersing agent includes a first dispersing agent represented by the following Formula 1, and a second dispersing agent represented by the following Formula 2:

[Chemical Formula 1]

[Chemical Formula 2]

wherein, in the above formulae, $R_1$ to $R_6$ are independently hydrogen or alkyl, $R_7$ to $R_{13}$ are selected from the group consisting of substituted or unsubstituted alkyl, substituted or unsubstituted alkenyl, substituted or unsubstituted alkynyl, substituted or unsubstituted aryl, substituted or unsubstituted heteroaryl, substituted or unsubstituted arylalkyl, substituted or unsubstituted cycloalkyl, substituted or unsubstituted heterocycloalkyl, substituted or unsubstituted cycloalkenyl, substituted or unsubstituted cycloalkynyl, substituted or unsubstituted alkoxy, substituted or unsubstituted alkylamino, substituted or unsubstituted alkoxyamino, and substituted or unsubstituted alkanol, m is in the range of about 30 to about 70 mol %, n is in the range of about 30 to about 70 mol %, and k and k' are independently integers ranging from 0 to 18.

Another embodiment of the present invention provides a color filter fabricated by patterning with the pigment dispersion composition.

Further embodiments of the present invention will also be described in detail.

The pigment dispersion composition according to an embodiment of the present invention is capable of achieving a fine dispersion by using dispersing agents having structures of the Formulae 1 and 2, so that the resist composition for a color filter using the pigment dispersion solution can improve the resolution and decrease pattern residues during exposure and development processes. By using such a resist composition for a color filter, it is possible to provide a color filter for a device such as a CMOS and a CCD image sensor in which sensitivity and pixels are improved for an LCD display device.

DETAILED DESCRIPTION OF THE INVENTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

The pigment dispersion composition according to one embodiment includes [A] a pigment, [B] a binder resin, [C] a solvent, and [D] a dispersing agent. The dispersing agent includes a first dispersing agent represented by the following Formula 1 and a second dispersing agent represented by the following Formula 2:

[Chemical Formula 1]

[Chemical Formula 2]

wherein, in the above formulae, $R_1$ to $R_6$ are independently hydrogen or alkyl, $R_7$ to $R_{13}$ are selected from the group consisting of substituted or unsubstituted alkyl, substituted or unsubstituted alkenyl, substituted or unsubstituted alkynyl, substituted or unsubstituted aryl, substituted or unsubstituted heteroaryl, substituted or unsubstituted arylalkyl, substituted or unsubstituted cycloalkyl, substituted or unsubstituted heterocycloalkyl, substituted or unsubstituted cycloalkenyl, substituted or unsubstituted cycloalkynyl, substituted or unsubstituted alkoxy, substituted or unsubstituted alkylamino, substituted or unsubstituted alkoxyamino, and substituted or unsubstituted alkanol, m is in the range of 30 to 70 mol %, n is in the range of 30 to 70 mol %, and k and k' are independently integers ranging from 0 to 18.

Hereinafter, the constituent components of the pigment dispersion composition according to the present invention will be described in detail.

[A] Pigment

The pigment may include organic pigments and inorganic pigments, for example red dipyrrolopyrrol pigments such as C. I. Pigment Red 254, 255, 264, 270, and 272; pigments such as C. I. Pigment Red 177 and 89; green halogen-substituted copper phthalocyanin pigments such as C. I. Pigment Green 36 and C. I. Pigment Green 7; blue copper phthalocyanin pigments such as C. I. Pigment Blue 15:6, 15, 15:1, 15:2, 15:3, 15:4, 15:5, and 16; yellow isoindoline-based pigments such as C. I. Pigment Yellow 139; yellow quinophthalone-based pigments such as C. I. Pigment Yellow 138; yellow nickel complex pigments such as C. I. Pigment Yellow 150; and mixtures thereof.

Furthermore, the pigments may be selectively pretreated with a water-soluble inorganic salt and a wetting agent.

The pretreatment process includes pretreating the pigments to pulverize the primary particle diameter of the pigment as follows.

S1: Kneading the pigment with a water-soluble inorganic salt and a wetting agent S2: Filtering and water-washing the pigment obtained from S1

The kneading process of S1 is conducted with a water-soluble inorganic salt such as sodium chloride, potassium chloride, calcium chloride, and the like under the condition of about 40 to about 100° C. The filtering and water-washing process of S2 is conducted by washing the inorganic salt with water and filtering the same.

The water-soluble inorganic salt is added in the kneading process, and can include sodium chloride, potassium chloride, calcium chloride, and the like.

The wetting agent is added together with the water-soluble inorganic salt and plays a role of helping to uniformly mix the pigment and the inorganic salt and to facilitate the pulverization of pigment, and includes, for example, alkylene glycol monoalkylethers such as ethylene glycol monoethylether, propylene glycol monomethylether, diethylene glycol monomethylether, and the like; alcohols such as ethanol, isopropanol, butanol, hexanol, cyclohexanol, ethylene glycol, diethylene glycol, polyethylene glycol, glycerine polyethylene glycol and the like; and combinations thereof.

The pigment obtained after the kneading process is measured for average particle diameter with a transmission electron microscope (TEM).

According to one embodiment, the average particle diameter D50 of the pigment ranges from about 30 to about 100 nm. When the pigment has an average particle diameter D50 of less than about 30 nm, durability such as thermal resistance and photo resistance can deteriorate after being patterned. On the other hand, when the pigment has an average particle diameter D50 of more than about 100 nm, it can be difficult to form a fine pattern.

[B] Binder Resin

The binder resin may be at least one acrylate-based copolymer resin obtained from a monomer such as acrylic acid, alkyl methacrylate, aryl methacrylate, alcohol methacrylate, alkylaryl methacrylate, succinic methacrylate, styrene, N-benzyl phthalic imide, and the like.

Exemplary monomers include acrylic acid, methacrylic acid, methylmethacrylate, ethylmethacrylate, propylmethacrylate, ethylhexylmethacrylate, phenylmethacrylate, acrylic acid benzylmethacrylate, benzylmethacrylate, tolylmethacrylate, o-silylmethacrylate, glycerolmethacrylate, alkylarylmethacrylate, and succinic methacrylate.

The binder resin is added in an amount of about 1 to about 50 parts by weight based on 100 parts by weight of the pigment. When the binder resin is added in an amount of less than about 1 part by weight, the dispersion may be neither effective nor stable. On the other hand, when the binder resin is added in an amount of more than about 50 parts by weight, the viscosity can significantly increase to deteriorate the optical, physical, and chemical characteristics of the resultant products.

[C] Solvent

The solvent is not specifically limited, and any conventional solvent may be used singularly or in combination. For example, the solvent may be an alcohol such as methanol, ethanol, and the like; ether such as dichloroethyl ether, n-butyl ether, diisoamyl ether, methylphenyl ether, tetrahydrofuran, and the like; glycol ether such as ethylene glycol monomethylether, ethylene glycol monoethylether, and the like; cellosolve acetate such as methyl cellosolve acetate, ethyl cellosolve acetate, diethyl cellosolve acetate, and the like; carbitol such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetate such as propylene glycol methylethyl acetate, propylene glycol methylether acetate, propylene glycol propylether acetate, and the like; aromatic hydrocarbon such as toluene, xylene, and the like; ketone such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl ester such as ethyl acetate, n-butyl acetate, isobutyl acetate, and the like; lactic acid ester such as methyl lactate, ethyl lactate, and the like; oxyacetate alkyl ester such as methyl oxyacetate, ethyl oxyacetate, butyl oxyacetate, and the like; alkoxy alkyl acetate ester such as methoxy methyl acetate, methoxy ethyl acetate, methoxy butyl acetate, ethoxy methyl acetate, ethoxy ethyl acetate, and the like; 3-oxy propionic acid alkyl ester such as 3-oxy methyl propionate, 3-oxy ethyl propionate, and the like; 3-alkoxy propionic acid alkyl ester such as 3-methoxy methyl propionate, 3-methoxy ethyl propionate, 3-ethoxy ethyl propionate, 3-ethoxy methyl propionate, and the like; 2-oxy propionic acid alkyl ester such as 2-oxy methyl propionate, 2-oxy ethyl propionate, 2-oxy propyl propionate, and the like; 2-alkoxy propionic acid alkyl ester such as 2-methoxy methyl propionate, 2-methoxy ethyl propionate, 2-ethoxy ethyl propionate, 2-ethoxy methyl propionate, and the like; 2-oxy-2-methyl propionic acid ester such as 2-oxy-2-methyl methyl propionate, 2-oxy-2-methyl ethyl propionate, and the like; monooxy monocarboxylic acid alkyl ester of a 2-alkoxy-2-methyl propionic acid alkyl such as 2-methoxy-2-methyl methyl propionate, 2-ethoxy-2-methyl ethyl propionate, and the like; ester such as 2-hydroxy ethyl propionate, 2-hydroxy-2-methyl ethyl propionate, hydroxy ethyl acetate, 2-hydroxy-3-methyl methyl butanoate, and the like; or ketonic acid ester such as ethyl pyruvate. Further exemplary solvents may include N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetyl acetone, isophorone, caproic acid, caprylic acid, 1-octanol, 1-nonanol, benzylalcohol, benzyl acetate, ethyl benzoate, diethyl oxalate, diethyl maleate, γ-butyrolactone, carbonate ethylene, carbonate propylene, phenyl cellosolve acetate, and the like.

Of the above solvents, glycol ethers such as ethylene glycol monoethyl ether; cellosolve acetates such as ethyl cellosolve acetate; esters such as 2-hydroxy ethyl propionate; carbitols such as diethylene glycol monomethyl ether; and propylene glycol alkylether acetates such as propylene glycol methylether acetate, propylene glycol propylether acetate, and the like may be appropriate in terms of compatibility and reactivity.

The solvent is added in an amount of about 10 to about 1000 parts by weight based on 100 parts by weight of the pigment, for example from about 20 to about 500 parts by weight based on 100 parts by weight of the pigment. When the solvent is added in an amount less than about 10 parts by weight, the viscosity of the pigment dispersion composition can excessively increase. On the other hand, when the solvent is added in an amount more than about 1000 parts by weight, the viscosity of the composition can decrease, which can deteriorate physical and optical characteristics of the resultant products.

[D] Dispersing Agent

The dispersing agent includes a first dispersing agent represented by the following Formula 1 and a second dispersing agent represented by the following Formula 2:

[Chemical Formula 1]

[Chemical Formula 2]

wherein, in the above formulae, $R_1$ to $R_6$ are independently hydrogen or alkyl, $R_7$ to $R_{13}$ are selected from the group consisting of substituted or unsubstituted alkyl, substituted or unsubstituted alkenyl, substituted or unsubstituted alkynyl, substituted or unsubstituted aryl, substituted or unsubstituted heteroaryl, substituted or unsubstituted arylalkyl, substituted or unsubstituted cycloalkyl, substituted or unsubstituted heterocycloalkyl, substituted or unsubstituted cycloalkenyl, substituted or unsubstituted cycloalkynyl, substituted or unsubstituted alkoxy, substituted or unsubstituted alkylamino, a substituted or unsubstituted alkoxyamino, and substituted or unsubstituted alkanol, m is in the range of 30 to 70 mol %, n is in the range of 30 to 70 mol %, and k and k' are independently integers ranging from 0 to 18.

The term "alkyl" refers to a $C_1$-$C_{15}$ alkyl, "alkenyl" refers to a $C_2$-$C_{16}$ alkenyl, "alkynyl" refers to a $C_2$-$C_{16}$ alkynyl, "aryl" refers to a $C_6$-$C_{18}$ aryl, "heteroaryl" refers to a $C_2$-$C_{16}$ heteroaryl, "arylalkyl" refers to a $C_7$-$C_{18}$ arylalkyl, "cycloalkyl" refers to a $C_3$-$C_{15}$ cycloalkyl, "heterocycloalkyl" refers to a $C_3$-$C_{20}$ heterocycloalkyl, "cycloalkenyl" refers to a $C_3$-$C_{15}$ cycloalkenyl, "cycloalkynyl" refers to a $C_6$-$C_{15}$ cycloalkynyl, and "alkoxy" refers to a $C_1$-$C_{20}$ alkoxy. The "alkanol" refers to a $C_1$-$C_{15}$ alkanol.

The terms heteroaryl and heterocycloalkyl refer to an aryl and cycloalkyl including 1 to 3 heteroatoms selected from the group consisting of N, O, S, and P.

As used herein, the term "substituted" refers to one substituted with at least one substituent selected from the group consisting of hydroxyl, alkoxy, nitro, cyano, amino, azido, amidino, hydrazino, hydrazono, carbonyl, carbamyl, thiol, ester, carboxyl or a salt thereof, sulfonic acid or a salt thereof, phosphoric acid or a salt thereof, $C_1$-$C_{15}$ alkyl, $C_2$-$C_{16}$ alkenyl, $C_2$-$C_{16}$ alkynyl, $C_6$-$C_{18}$ aryl, $C_7$-$C_{18}$ arylalkyl, $C_3$-$C_{15}$ cycloalkyl, $C_3$-$C_{15}$ cycloalkenyl, and $C_6$-$C_{15}$ cycloalkynyl.

The first dispersing agent and the second dispersing agent are used in combination. When the first dispersing agent is not used, the pigment dispersion composition may not be developed upon preparing a resist composition for a color filter. When the second dispersing agent is not added, the pigment may not be dispersed.

The first dispersing agent is mixed with the second dispersing agent in a weight ratio ranging from about 90:10 to about 10:90, for example from about 30:70 to about 70:30. When the first dispersing agent and the second dispersing agent are used in an amount within the above weight ratio ranges, it is possible to provide a fine dispersion and dispersing property and to improve the developing property upon preparing a resist composition for a color filter.

The first dispersing agent and the second dispersing agent are added in an amount of about 10 to about 80 parts by weight based on 100 parts by weight of the pigment. When the first dispersing agent and the second dispersing agent are added in an amount of less than about 10 parts by weight, it can be impossible to achieve effective dispersion, while when the first dispersing agent and the second dispersing agent are added in an amount of more than about 80 parts by weight, the viscosity of the product can significantly increase, which can deteriorate the optical, physical, and chemical characteristics when preparing the products.

The first dispersing agent and the second dispersing agent are commercially available. Examples of the first dispersing agent include products sold under the name of Disperse BYK 2000, Disperse BYK 2001 and the like; and examples of the second dispersing agent include products sold under the name of Disperbyk 111, Disperbyk 112, and the like.

The pigment dispersion composition according to the present invention further includes a third dispersing agent as needed.

The third dispersing agent is one or more selected from the group consisting of polycarbonic acid esters, unsaturated polyamides, polycarbonic acids, polycarbonic acid alkyl amine salts, polyacryls, polyethyleneimines, polyurethanes, polyethers, acrylic resins, phosphoric acid estrs, and modified urethanes.

The third dispersing agent is commercially available and includes, for example, Disperse BYK 161, Disperse BYK 163, and Disperse BYK 164 manufactured by BYK Inc.; EFKA 4046 and EFKA 4047 manufactured by EFKA Inc.; Solsperse 24000 manufactured by Lubrizol Corporation, and the like.

The third dispersing agent is added in an amount of 1 to 4 parts by weight based on 100 parts by weight of the pigment. When the third dispersing agent is added in an amount of less than 1 part by weight, the viscosity may not provide the desired dispersion stability. On the other hand, when the third dispersing agent is added in an amount of more than 4 parts by weight, the viscosity may increase too much to maintain the developing property.

The pigment dispersion composition according to the present invention may further include a colorant derivative if required. The colorant derivative can be a pigment including the above-mentioned pigment or a compound introduced with a dye substituent.

Examples of the colorant derivative may include a naphthalene-based, anthraquinone-based, phthalocyanine-based, diketopyrrolopyrrol-based, or azo-based pigment, or a dye having a substituent selected from the group consisting of sulfone amine salts, sulfone sodium salts, quaternary amine phosphorus salts, alkylamines, triazine derivatives, and combinations thereof.

The colorant derivative may be added in an amount of 1 to 10 parts by weight based on 100 parts by weight of the pigment. When the colorant derivative is added in an amount of less than 1 part by weight, it can be impossible to provide a fine dispersion. On the other hand, when the colorant derivative is added in an amount of more than 10 parts by weight, the viscosity can increase which can deteriorate the developing property.

The pigment having the above-mentioned pigment dispersion composition has a dispersing particle diameter ranging from about 40 to about 100 nm.

According to another embodiment of the present invention, provided is a resist composition for a color filter prepared using the pigment dispersion composition having the above-mentioned composition.

The resist composition for a color filter includes a pigment dispersion composition, an alkali soluble resin, a photopolymerization monomer, a photopolymerization initiator, and a solvent.

The pigment dispersion composition is the same as described above.

The alkali soluble resin is a carboxyl-containing acrylic-based copolymer that is a copolymer of an ethylenic unsaturated monomer having at least one carboxyl group and another ethylenic unsaturated monomer copolymerizable with the ethylenic unsaturated monomer having at least one carboxyl group. Specific examples of the alkali soluble resin are a methacrylic acid/methyl methacrylate copolymer, a methacrylic acid/benzyl methacrylate copolymer, a methacrylic acid/benzyl methacrylate/styrene copolymer, a methacrylic acid/benzyl methacrylate/2-hydroxy ethyl methacrylate copolymer, methacrylic acid/benzyl methacrylate/styrene/2-hydroxy ethyl methacrylate copolymer, and the like.

The photopolymerization monomer may be a multifunctional monomer having at least two hydroxy groups. Specific examples of the photopolymerization monomer include glycerol methacrylate, pentaerythrytol hexaacrylate, ethylene glycol diacrylate, triethylene glycol diacrylate, 1,4-butane diol diacrylate, 1,6-hexane diol diacrylate, neopentyl glycol diacrylate, pentaerythrytol diacrylate, pentaerythrytol triacrylate, pentaerythrytol diacrylate, dipentaerythrytol triacrylate, dipentaerythrytolacrylate, pentaerythrytol hexaacrylate, bisphenol A diacrylate, trimethylolpropanetriacrylate, novolac epoxyacrylate, ethylene glycol dimethacrylate, diethylene glycol dimethacrylate, triethylene glycol dimethacrylate, propylene glycol dimethacrylate, 1,4-butane diol dimethacrylate, 1,6-hexane diol dimethacrylate, and the like.

The photopolymerization initiator may be any conventional photopolymerization initiator known in the art that is generally used in resist compositions, such as acetophenone-based compounds, benzophenone-based compounds, thioxanthone-based compounds, benzoin-based compounds, triazine-based compounds, and combinations thereof.

Examples of the acetophenone-based compound may include 2,2'-diethoxyacetophenone, 2,2'-dibutoxyacetophenone, 2-hydroxy-2-methylpropropiopenonephenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone-based compound may include benzophenone, benzoyl benzoic acid, benzoyl methyl benzoate, 4-phenyl benzophenone, hydroxy benzophenone, acrylated benzophenone, 4,4'-bis(dimethylamino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

Examples of the thioxanthone-based compound may include thioxanthone, 2-crolthioxanthone, 2-methylthioxanthone, isopropyl thioxanthone, 2,4-diethyl thioxanthone, 2,4-diisopropyl thioxanthone, 2-chlorothioxanthone, and the like.

Examples of the benzoin-based compound may include benzoin, benzoin methyl ether, benzoin ethyl ether, benzoin isopropyl ether, benzoin isobutyl ether, benzyldimethylketal, and the like.

Examples of the triazine-based compound may include 2,4,6,-trichloro s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl 4,6-bis(trichloromethyl)-s-triazine, bis(trichloromethyl)-6-styryl s-triazine, 2-(naphto1-yl)-4,6-bis(trichloromethyl)-s-triazine, 2-(4-methoxynaphto1-yl)-4,6-bis(trichloromethyl)-s-triazine, 2-4-tri chloro methyl(piperonyl)-6-triazine, 2-4-tri chloro methyl (4'-methoxystyryl)-6-triazine, and the like.

Other examples of the photopolymerization initiator may include carbazole-based compounds, diketone-based compounds, sulfonium borate-based compounds, diazo-based compounds, biimidazole-based compounds, and the like.

The solvent may be the same as the solvent described herein for the pigment dispersion composition according to the present invention.

Furthermore, the resist composition for a color filter may further include conventional additives such as a surfactant, a coupling agent, and a leveling agent as required.

Hereinafter, a method of manufacturing the resist composition for a color filter is described.

A photopolymerization initiator is dissolved and agitated in the solvent at room temperature for 1 to 2 hours. Then, an alkali soluble resin and a photopolymerizable monomer are added thereto and agitated at room temperature for 1 to 2 hours. The pigment dispersion composition according to one embodiment of the present invention is added and agitated at room temperature for 30 minutes to 1 hour, then filtered 2 to 5 times to remove impurities. In this manner, it is possible to provide a resist composition for a color filter according to the present invention.

In addition, according to another embodiment of the present invention, a color filter fabricated using the resist composition for a color filter prepared with the pigment dispersion composition having the above-mentioned composition is provided.

The color filter may be fabricated by a method including: coating the resist composition including the pigment dispersion composition as described herein on a wafer for a color filter in a thickness of between about 5000 and about 8000 Å in accordance with a coating process such as spin coating, slit coating, and the like; irradiating the coated resist composition layer to obtain a required pattern for the color filter; and treating the coating layer with an alkali developing solution to dissolve a non-exposed part of the coating layer and to provide a color filter having a required pattern. The light source for the irradiation may include 356 nm I-line light.

The process may be repeated depending upon the required number of colors of R, G, and B, so as to provide a color filter having a desired pattern. During the manufacturing process, the image pattern obtained after the development step may be hardened by reheating or irradiating with actinic radiation to improve crack-resistance, solvent-resistance, and the like.

It is possible to provide a color filter having a fine pixel of a micro-square pattern. Accordingly, the color filter fabricated using the resist composition for a color filter can exhibit high resolution when it is applied to an image sensor.

Figure 3:
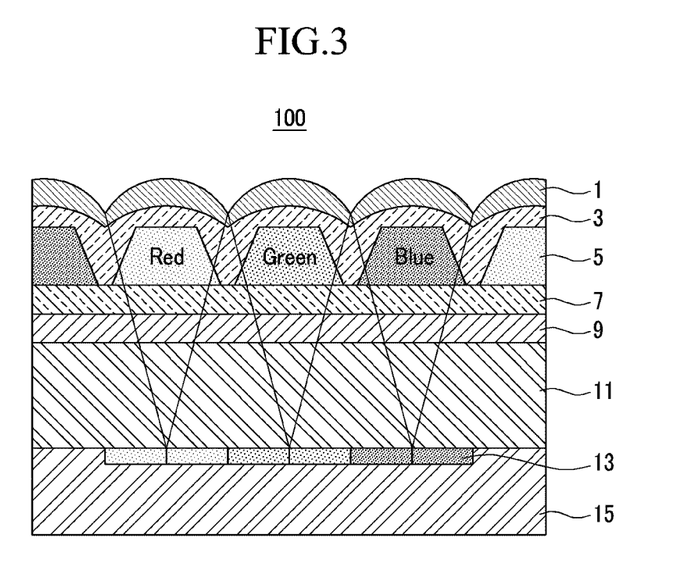
FIG. 3 is a schematic view of a complementary metal oxide semiconductor (CMOS) image sensor according to one embodiment of the present invention.

FIG. 3 is a schematic view of a complementary metal oxide semiconductor (CMOS) image sensor according to one embodiment of the present invention.

As shown in FIG. 3, a complementary metal oxide semiconductor (CMOS) image sensor 100 including the image sensor color filter according to one embodiment of the present invention includes a second overcoating layer (OCL) 3 and a color filter 5 under a microlens 1; a first overcoating layer (OCL) 7, a passivation layer 9, and a inter-metal dielectric layer (IMD) 11 under the color filter 5; and a photodiode 13 and an interlayer insulating layer 15 under the inter-metal dielectric layer 11.

The following examples illustrate the present invention in more detail. However, it is understood that the present invention is not limited by these examples.

Preparation of Pigment Dispersion Composition

Example 1

A pigment dispersion composition is prepared by dispersing a composition as follows with a bead mill for 3 hours.

| | |
|---|---|
| C.I. Pigment Red 254 (produced by Ciba Specialty Chemicals, Irgaphor Red BT-CF) | 15 parts by weight |
| First dispersing agent of Chemical Formula 1 (produced by BYK-Chemie, Disperbyk2001) | 5 parts by weight |
| Second dispersing agent of Chemical Formula 2 (produced by BYK-Chemie, Disperbyk111) | 2 parts by weight |
| Acrylic acid benzyl methacrylate copolymer (produced by Miwon Commercial Co., Ltd., NPR8000) | 5 parts by weight |
| Propylene glycol methylethylacetate | 55 parts by weight |

Example 2

A pigment dispersion composition is prepared in accordance with the same procedure as in Example 1, except that 2 parts by weight of the colorant derivative (Lubrizol Corporation, Solsperse 22000) is further added thereto.

Comparative Example 1

A pigment dispersion composition is prepared in accordance with the same procedure as in Example 1, except that the composition is changed as follows:

| | |
|---|---|
| C.I. Pigment Red 254 (produced by Ciba Specialty Chemicals, Irgaphor Red BT-CF) | 15 parts by weight |
| Polyimine-based dispersing agent (produced by EFKA, EFKA4046) | 5 parts by weight |
| Acrylic acid benzyl methacrylate copolymer (produced by Miwon Commercial Co., Ltd., NPR8000) | 5 parts by weight |
| Propylene glycol methylethylacetate | 55 parts by weight |
| Colorant derivative (produced by Lubrizol Corporation, Solsperse 22000) | 2 parts by weight |

Comparative Example 2

A pigment dispersion composition is prepared in accordance with the same procedure as in Example 1, except that the composition is changed as follows:

| | |
|---|---|
| C.I. Pigment Red 254 (Produced by Ciba Specialty Chemicals, Irgaphor Red BT-CF) | 15 parts by weight |
| First dispersing agent of Chemical Formula 1 (produced by BYK, Disperbyk2001) | 5 parts by weight |
| Acrylic acid benzyl methacrylate copolymer (produced by Miwon Commercial Co., Ltd., NPR8000) | 5 parts by weight |
| Propylene glycol methylethylacetate | 55 parts by weight |

Measurement for Primary Average Particle Diameter of Pigment

Pigment dispersion compositions according to Examples 1 and 2 and Comparative Examples 1 and 2 are measured for average particle diameter by a light scattering particle diameter analyzer (manufactured by Horoba Inc. LB-500), and for viscosity by a viscosity analyzer (manufactured by Brookfield Inc.—DV Ultra), and the results are shown in the following Table 1.

TABLE 1

| Pigment dispersion composition | Ex. 1 | Ex. 2 | Comp. Ex. 1 | Comp. Ex. 2 |
|---|---|---|---|---|
| Average particle diameter of pigment (in dispersion) (nm) | 65 | 60 | 90 | 85 |
| Viscosity (cP) | 9.5 | 10 | 10 | 9.3 |

As shown in Table 1, as pigment dispersion compositions according to Examples 1 and 2 are dispersed better than in Comparative Examples 1 and 2, it is confirmed that the average particle diameter of the pigment is remarkably decreased and the viscosity of the pigment dispersion composition is not increased in Examples 1 and 2 even though they include the pulverized pigment particles. The results confirm that the pigment dispersion compositions according to Examples 1 and 2 exhibit improved dispersion stability.

Preparation of Resist Composition for Color Filter

Example 3

A resist composition for a color filter is prepared by agitating the following composition including the pigment dispersion composition according to Example 2 for 1 hour with a formulator.

| | |
|---|---|
| Pigment dispersion composition of Example 1 | 50 parts by weight |
| Acrylic acid benzyl methacrylate copolymer (produced by Miwon Commercial Co., Ltd., NPR8000) | 4 parts by weight |
| Multifunctional group monomer (Dongyang SYN Co., Ltd., DPHA) | 4 parts by weight |
| Propylene glycol methylethylacetate | 41.5 part by weight |
| Triazine-based photoinitiator (Nippon Kayaku Co., Ltd., TPP) | 0.5 part by weight |

Comparative Example 3

A resist composition for a color filter is prepared in accordance with the same procedure as in Example 3, except that the pigment dispersion composition according to Comparative Example 1 is used.

Comparative Example 4

A resist composition for a color filter is prepared in accordance with the same procedure as in Example 3, except that the pigment dispersion composition according to Comparative Example 2 is used.

Scanning Electron Microscope (SEM) Analysis of Pattern for Color filter

Each resist composition for a color filter obtained from Example 3 and Comparative Examples 3 and 4 is coated on a silicon wafer (LG Siltron) at a thickness of 0.8 μm with a spin coater (KDNS, K-Spin8) and exposed for 350 ms by an exposer (Nikon, I10C), then developed with a developing solution (TMAH 0.4%) to provide a pattern. After that, they are tested for resolution and pattern residues with a CD SEM analyzer (KLA-Tencor, 8100XP).

Figure 1A:
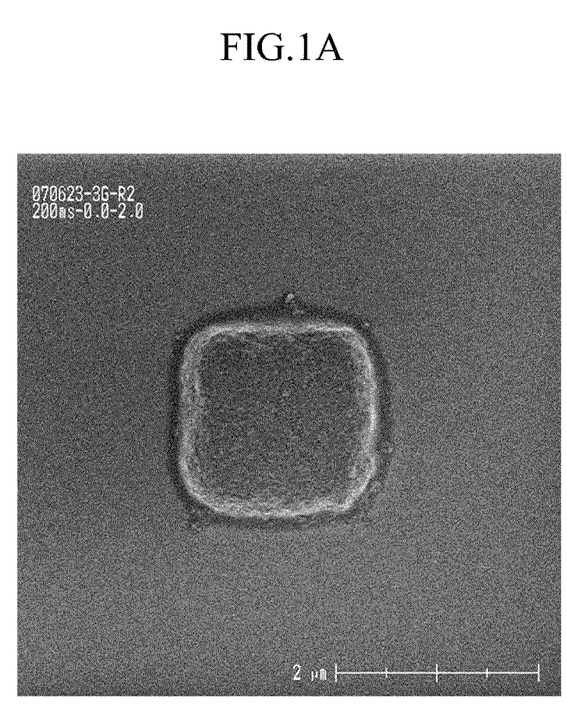
FIG. 1A is a scanning electron microscope (SEM) photograph of a pattern obtained using a resist composition for a color filter including a pigment dispersion composition according to Example 3.
Figure 1B:
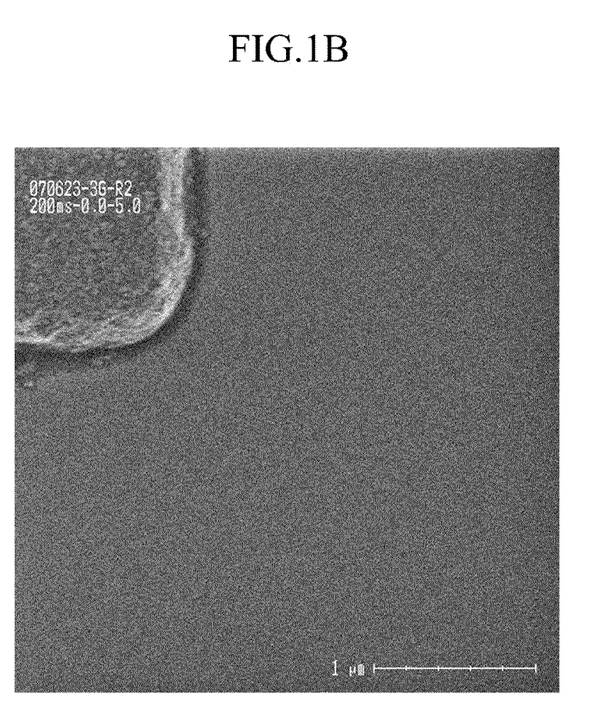
FIG. 1B is a partially enlarged scanning electron microscope photograph of FIG. 1A.
Figure 2A:
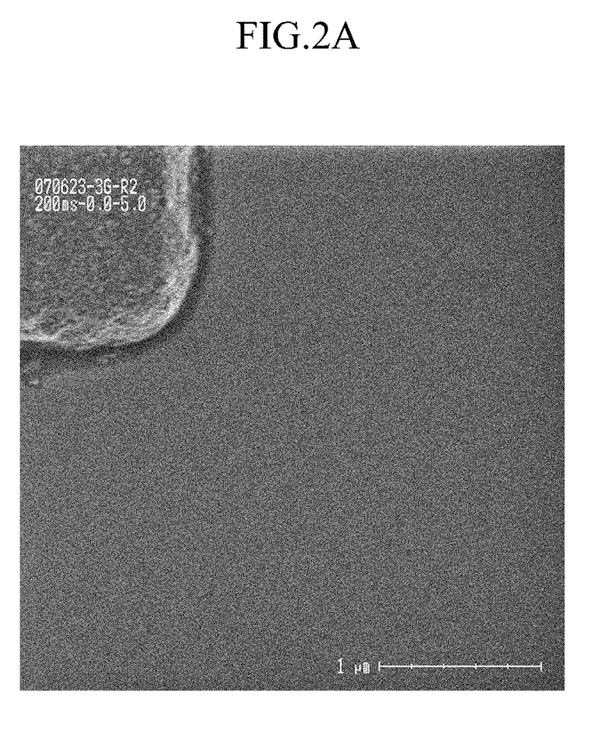
FIG. 2A is a scanning electron microscope (SEM) photograph of a pattern obtained using a resist composition for a color filter including a pigment dispersion composition according to Comparative Example 3.
Figure 2B:
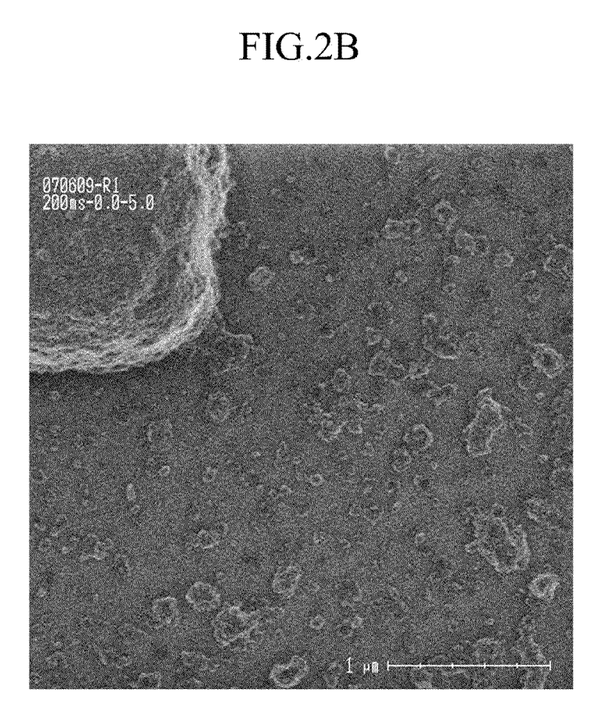
FIG. 2B is a partially enlarged scanning electron microscope photograph of FIG. 2A.

FIG. 1A (Example 3) and FIG. 2A (Comparative Example 3) show resolutions of patterns of 2.0 μm, respectively, FIG. 1B (Example 3) and FIG. 2B (Comparative Example 3) show the pattern residue results thereof, respectively.

As shown in FIG. 1A and FIG. 2A, in the resist composition for a color filter according to Example 3, the developed pattern has a higher square resolution than in Comparative Example 3. Furthermore, as shown in FIG. 1B and FIG. 2B, pattern residues rarely exist in the resist composition for a color filter according to Example 3, while more pattern residues exist in the resist composition for a color filter according to Comparative Example 3.

Furthermore, it is confirmed that, in the resist composition for a color filter according to Comparative Example 4 including only the first dispersing agent, the pattern is not developed after being exposed.

It can be seen from the results that a resist composition including the pigment dispersion composition including both the first dispersing agent and the second dispersing agent exhibits improved resolution and decreased pattern residues during the patterning process.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A pigment dispersion composition comprising a pigment, a binder resin, a solvent, and a dispersing agent, wherein the dispersing agent comprises a first dispersing agent represented by the following Formula 1 and a second dispersing agent represented by the following Formula 2, and wherein the first dispersing agent is mixed with the second dispersing agent in a weight ratio ranging from about 70:30 to about 90:10:

[Chemical Formula 1]

[Chemical Formula 2]

wherein, in the above formulae, $R_1$ to $R_6$ are independently hydrogen or alkyl, $R_7$ to $R_{13}$ are selected from the group consisting of substituted or unsubstituted alkyl, substituted or unsubstituted alkenyl, substituted or unsubstituted alkynyl, substituted or unsubstituted aryl, substituted or unsubstituted heteroaryl, substituted or unsubstituted arylalkyl, substituted or unsubstituted cycloalkyl, substituted or unsubstituted heterocycloalkyl, substituted or unsubstituted cycloalkenyl, substituted or unsubstituted cycloalkynyl, substituted or unsubstituted alkoxy, substituted or unsubstituted alkylamino, substituted or unsubstituted alkoxyamino, and substituted or unsubstituted alkanol, m is in the range of about 30 to about 70 mol %, n is in the range of about 30 to about 70 mol %, and k and k' are independently integers ranging from 0 to 18.

2. The composition of claim 1, wherein the composition comprises about 1 to about 50 parts by weight of the binder resin, about 10 to about 1000 parts by weight of the solvent, and about 10 to about 80 parts by weight of the dispersing agent, based on 100 parts by weight of the pigment.

3. The composition of claim 1, wherein the composition further comprises a third dispersing agent selected from the group consisting of polycarbonic acid esters, unsaturated polyamides, polycarbonic acids, polycarbonic acid alkyl amine salts, polyacryls, polyethyleneimines, polyurethanes, polyethers, acryl resins, phosphoric acid esters, and modified urethanes.

4. The composition of claim 1, wherein the pigment has an average particle diameter (D50) of about 30 to about 100 nm.

5. The composition of claim 1, wherein the pigment is selected from the group consisting of red dipyrrolopyrrol pigments, red anthraquinone-based pigments, green copper phthalocyanine pigments substituted with halogen, blue copper phthalocyanine pigments, yellow iso indoline-based pigments, yellow quinophthalone-based pigments, and yellow nickel complex pigments.

6. The composition of claim 1, wherein the binder resin is an acrylate-based resin obtained by copolymerization of a monomer selected from the group consisting of acrylic acid, alkyl methacrylate, aryl methacrylate, alcohol methacrylate, alkylaryl methacrylate, succinic methacrylate, styrene, N-benzyl phthalic imide, and combinations thereof.

7. The composition of claim 1, wherein the composition further comprises about 1 to about 10 parts by weight of a colorant derivative based on 100 parts by weight of the pigment.

8. The composition of claim 7, wherein the colorant derivative is a naphthalene-based, anthraquinone-based, phthalocyanine-based, diketopyrrolopyrrol-based, or azo-based pigment, or a dye having a substituent selected from the group consisting of sulfone amine salts, sulfone sodium salts, quaternary amine phosphorus salts, alkylamines, triazine derivatives, and combinations thereof.

9. A resist composition for a color filter comprising the pigment dispersion composition according to claim 1.

10. A color filter fabricated using the resist composition for a color filter according to claim 9.

* * * * *